US007233043B2

(12) United States Patent
Pattanayak

(10) Patent No.: US 7,233,043 B2
(45) Date of Patent: Jun. 19, 2007

(54) TRIPLE-DIFFUSED TRENCH MOSFET

(75) Inventor: Deva N. Pattanayak, Cupertino, CA (US)

(73) Assignee: Siliconix incorporated, Santa Clara, CA (US)

(*) Notice: Subject to any disclaimer, the term of this patent is extended or adjusted under 35 U.S.C. 154(b) by 180 days.

(21) Appl. No.: 11/150,016

(22) Filed: Jun. 10, 2005

(65) Prior Publication Data
US 2005/0280077 A1    Dec. 22, 2005

Related U.S. Application Data

(62) Division of application No. 10/657,830, filed on Sep. 8, 2003, now Pat. No. 6,913,977.

(51) Int. Cl.
    *H01L 29/76*    (2006.01)
(52) U.S. Cl. ............... 257/341; 257/331; 257/E21.418; 438/270; 438/E29.257
(58) Field of Classification Search ............ 257/331, 257/341, 401; 438/268, 270, 589
See application file for complete search history.

(56) References Cited

U.S. PATENT DOCUMENTS

| 4,084,175 | A | 4/1978 | Ouyang ................. 357/55 |
| 4,272,302 | A | 6/1981 | Jhabvala ............... 148/1.5 |
| 6,351,018 | B1* | 2/2002 | Sapp ..................... 257/499 |
| 6,521,498 | B2 | 2/2003 | Zandt et al. ........... 438/270 |
| 6,690,062 | B2 | 2/2004 | Henninger et al. ..... 257/340 |

* cited by examiner

*Primary Examiner*—Quoc Hoang
(74) *Attorney, Agent, or Firm*—Silicon Valley Patent Group LLP

(57) ABSTRACT

A trench-gated MOSFET includes adjacent mesas formed on opposite sides of a trench. A body region in the first mesa extends downward below the level of the trenches and laterally across the bottom of the trenches. The body region in the second mesa extends part of the way down the mesa, leaving a portion of the drain abutting the trench. The body region in the second mesa includes a channel region adjacent a wall of the trench. The area where the drain abuts the trench is thus relatively restricted and the drain-gate capacitance of the device is reduced. Moreover, the drain-gate capacitance is made independent of the depth and width of the trenches, allowing greater freedom in the design of the MOSFET.

7 Claims, 8 Drawing Sheets

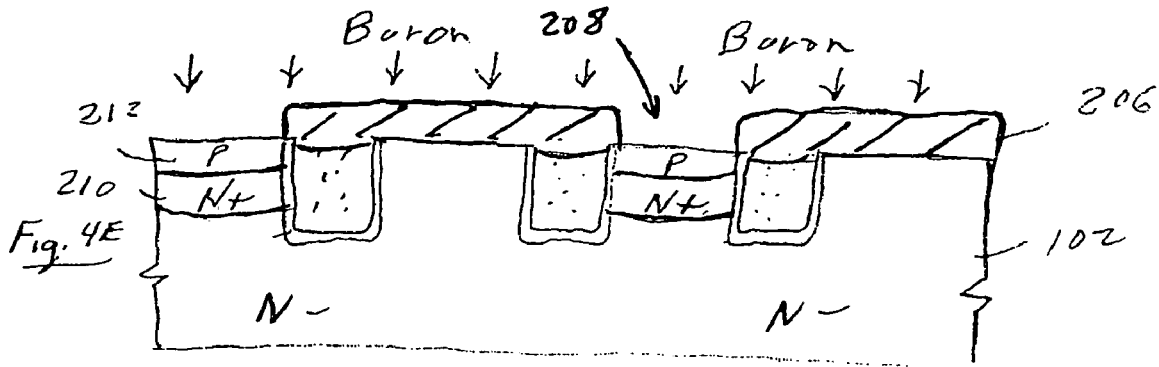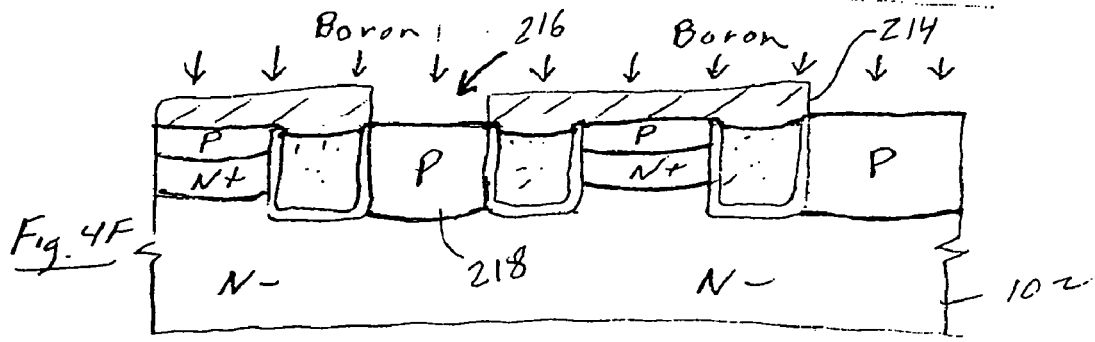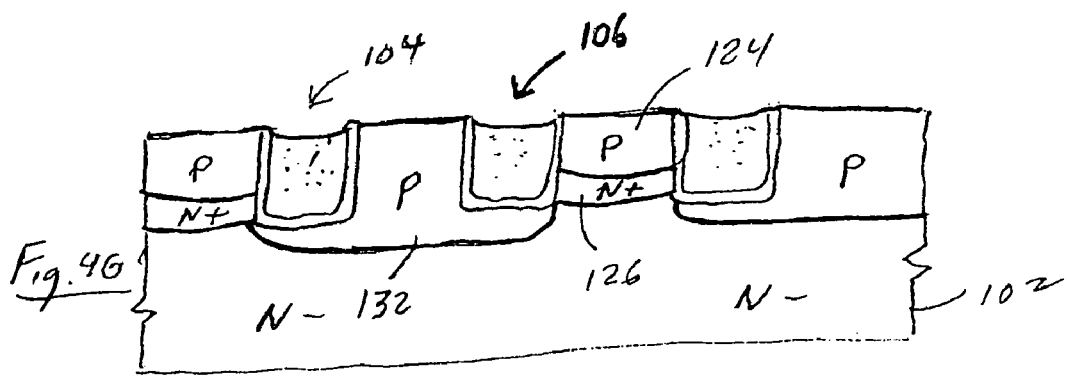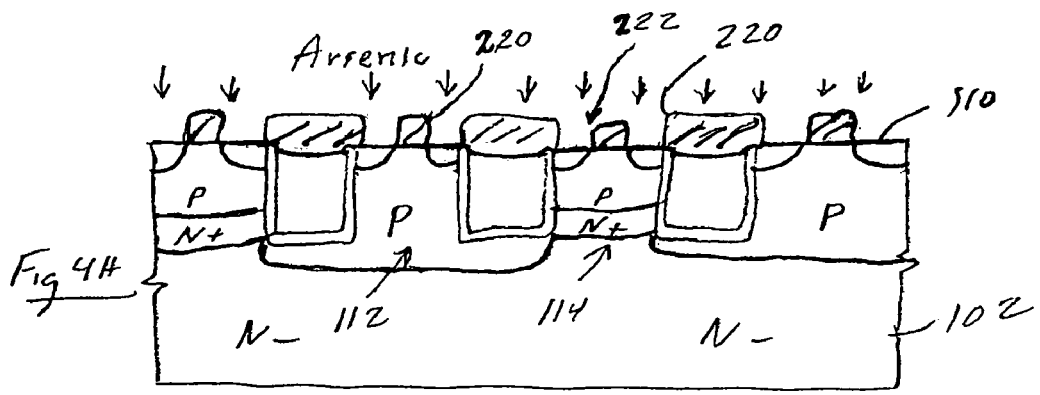

TRIPLE-DIFFUSED TRENCH MOSFET

This application is a divisional of application Ser. No. 10/657,830, filed Sep. 8, 2003, now U.S. Pat. No. 6,913,977 which is incorporated herein by reference in its entirety.

FIELD OF THE INVENTION

This invention relates to metal-oxide-silicon field-effect transistors (MOSFETs) and in particular to MOSFETs in which the gate electrode is located in a trench.

BACKGROUND OF THE INVENTION

Trench-gated MOSFETs have achieved wide acceptance because of their superior on-resistance characteristics. Because the current flow is primarily in a vertical direction, through a channel located adjacent a side wall of the trench, it is possible to obtain a higher cell packing density than is the case with MOSFETs having a significant horizontal current flow. This allows a greater flow of current per unit of area of the semiconductor chip. Thus the on-resistance characteristics of trench-gated MOSFETs are generally superior to those of, for example, planar double-diffused MOSFETs.

One problem, however, that has occurred with trench MOSFETs relates to the capacitance that exists between the gate and the drain. This problem is illustrated in FIG. 1, which is a cross-sectional view of a conventional trench MOSFET 10 formed in a semiconductor chip 12. A trench 14 is etched in chip 12, and is filled with a polysilicon gate 16. An insulating layer 18, typically oxide, lines the walls of trench 14 and insulates the gate 16 from chip 12. Chip 12 includes an N− drain region 20, a P-body region 22 and an N+ source region 24. Current flows between N+ source region 24 and N− drain region 20 through a channel region indicated by the dashed lines. The gate-drain capacitance develops in the area designated 26, where N− drain region 20 is separated from gate 16 by oxide layer 18. As indicated, area 26 is created by the fact that trench 14 extends into, i.e., overlaps, the N− drain region 20. This overlap has both a vertical component along the side walls of trench 14 and a horizontal component along the bottom of trench 14.

The presence of a sizeable gate-drain capacitance limits the speed at which MOSFET 10 can be operated. This effect has become more problematical as the device size has decreased and the speed (frequency) has become greater.

One possible solution to this problem is illustrated in FIG. 2, which shows a MOSFET 30 having many similar components (which are like-numbered) to those shown in MOSFET 10. In contrast, oxide layer 18 in MOSFET 30 includes a thick gate oxide portion 18A at the bottom of trench 14. Thick gate oxide portion 18A limits the capacitance between gate 16 and N− drain region 20. Since an accumulation region does not form under thick gate oxide portion 18A, the on-resistance of MOSFET 30 is somewhat greater than it would be if the bottom gate oxide were thin. Moreover, the bottom junction of P-body region 22 must be aligned properly with the top of thick gate oxide portion 18A. If, for example, thick gate oxide portion 18A extends sufficiently upward to the extent that it overlaps P-body region 22, the device cannot be turned on.

Thus a definite need exists for a technique for reducing the gate-drain capacitance of a MOSFET without sacrificing on-resistance.

SUMMARY

A trench MOSFET according to this invention includes a semiconductors chip and number of gate trenches formed in the chip which define intervening mesas. One of the mesas includes a body region and a source region. The body region includes a channel region adjacent a wall of the trench. A second mesa, located on an opposite side of the trench from the first mesa, includes a source region and a body region which extends downward below the trenches and laterally underneath the trenches. A drain region of the MOSFET borders the trench only in a region of the first mesa below the body region. Thus the drain-gate capacitance is greatly reduced and is rendered independent of the depth and width of the trenches.

The invention also includes methods of fabricating such a MOSFET. One illustrative method includes implanting a body dopant into the first mesa at a relatively low energy and implanting the body dopant into the second mesa at a relatively high energy such that the body dopant extends to a deeper level in the second mesa. The chip is annealed to drive in the body dopant, and the body dopant in the second mesa extends downward to the point where it reaches a level below the trenches and spreads laterally under the trenches. In one embodiment the body dopant in the second mesa extends across the entire bottom of the trenches and in effect "wraps around" the lower corners of the trenches.

There are numerous other methods that can be used to fabricate a MOSFET in accordance with this invention.

BRIEF DESCRIPTION OF THE DRAWINGS

FIGS. 4A–4H illustrate a process of forming the MOSFET shown in FIG. 3.

DESCRIPTION OF THE INVENTION

Figure 3A:
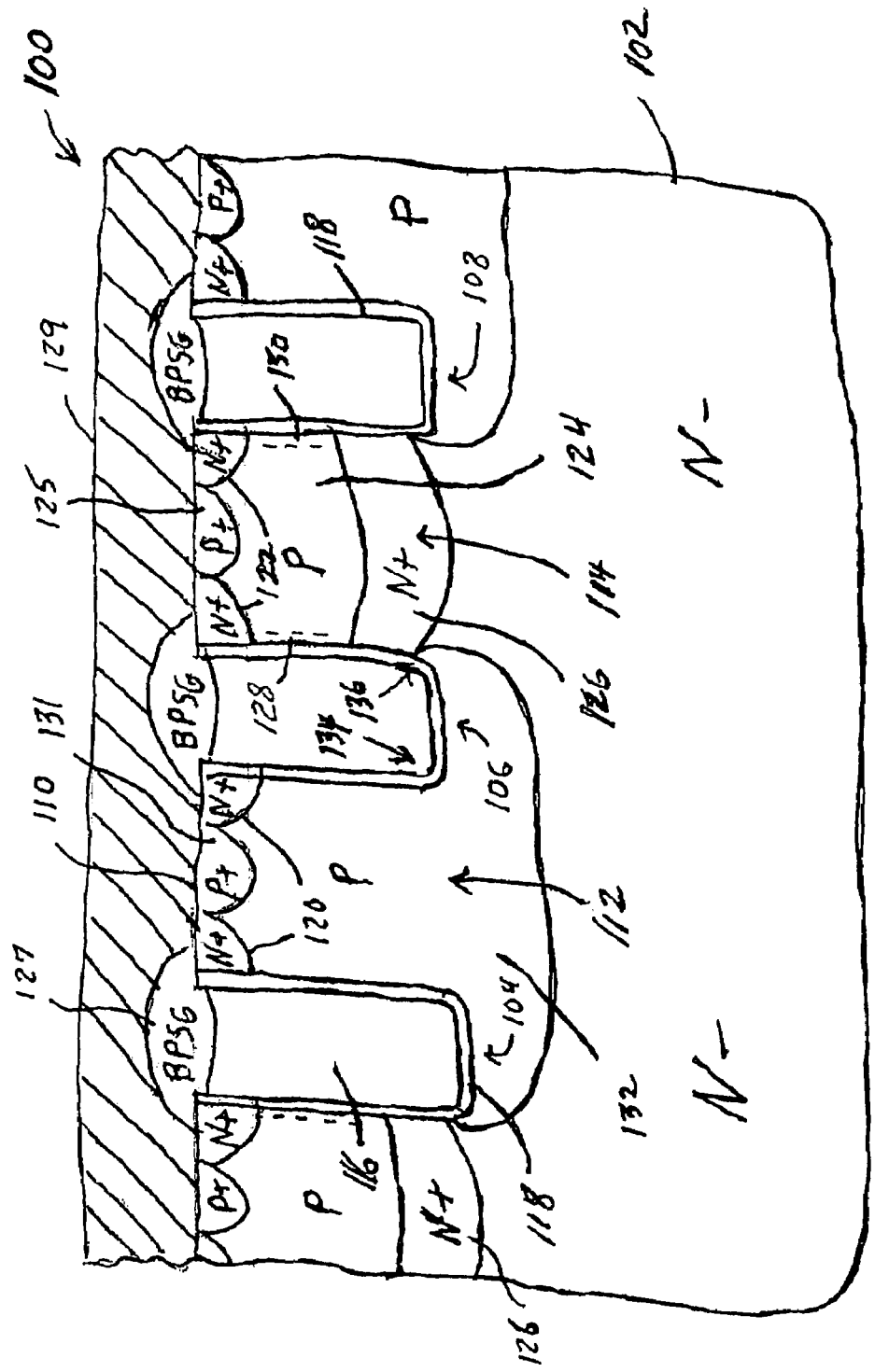
FIG. 3A shows a cross-sectional view of a MOSFET in accordance with this invention.

FIG. 3A shows a cross-sectional view of a MOSFET 100 in accordance with this invention. MOSFET 100 is formed in a semiconductor chip 102 which has a background doping of N-type impurity. Three trenches 104, 106 and 108 are formed at a top surface 110 of chip 102. (Note: While trenches 104, 106 and 108 are referred to as separate "trenches" it will be understood by those skilled in the art that trenches 104, 106 and 108 may in reality be parts or segments of the same "trench", i.e., trenches 104, 106 and 108 may be interconnected in a plane outside the cross-section of FIG. 3A.)

Trenches 104 and 106 together define a mesa 112, and trenches 106 and 108 together define a mesa 114. In a normal fashion each of trenches 104, 106 and 108 is filled with a conductive material such as polysilicon 116, which is separated from the semiconductor material of chip 102 by an insulating layer such as oxide layer 118.

Adjacent the top surface 110 are N+ source regions 120 in mesa 112 and N+ source regions 122 in mesa 114. Forming junctions with N+ source regions 122 is a P-body region 124 which in turn forms a junction with an N+ drain region 126 in mesa 114. Drain region 126 is in contact with the N− background doping of chip 102, which also forms a part of the drain of MOSFET 100. Within P-body region 124 are channel regions 128 and 130, which adjoin the walls of trenches 106 and 108, respectively, and which can be inverted by the potential of polysilicon 116 to allow a current to flow between N+ source regions 122 and N+ drain region 126 through channel regions 128 and 130.

A metal layer 129 is formed on top surface 110 to make ohmic contact with N+ source regions 122. A P+ body contact region 125 establishes ohmic contact between metal layer 129 and P-body region 124. A layer 127 of borophosphosilicate glass (BPSG) is formed over trenches 104, 106 and 108 to isolate the polysilicon 116 gate material from metal layer 129.

In mesa 112, a P-body region 132 forms junctions with N+ source regions 120. Unlike P-body region 124, P-body region 132 extends downward from the junctions with N+ source regions 120 and to a region below the trenches 104 and 106. In this embodiment, P-body region 132 forms a junction with N+ drain region 126 in mesa 114. Trench 106 has lower corners 134 and 136 at the intersection of the walls and bottom of trench 106 and P-body region 132 "wraps around" corners 134 and 136. Like mesa 114, mesa 112 contains a P+ body contact region 131, which provides an ohmic contact between P-body region 132 and metal layer 129.

Figure 3B:
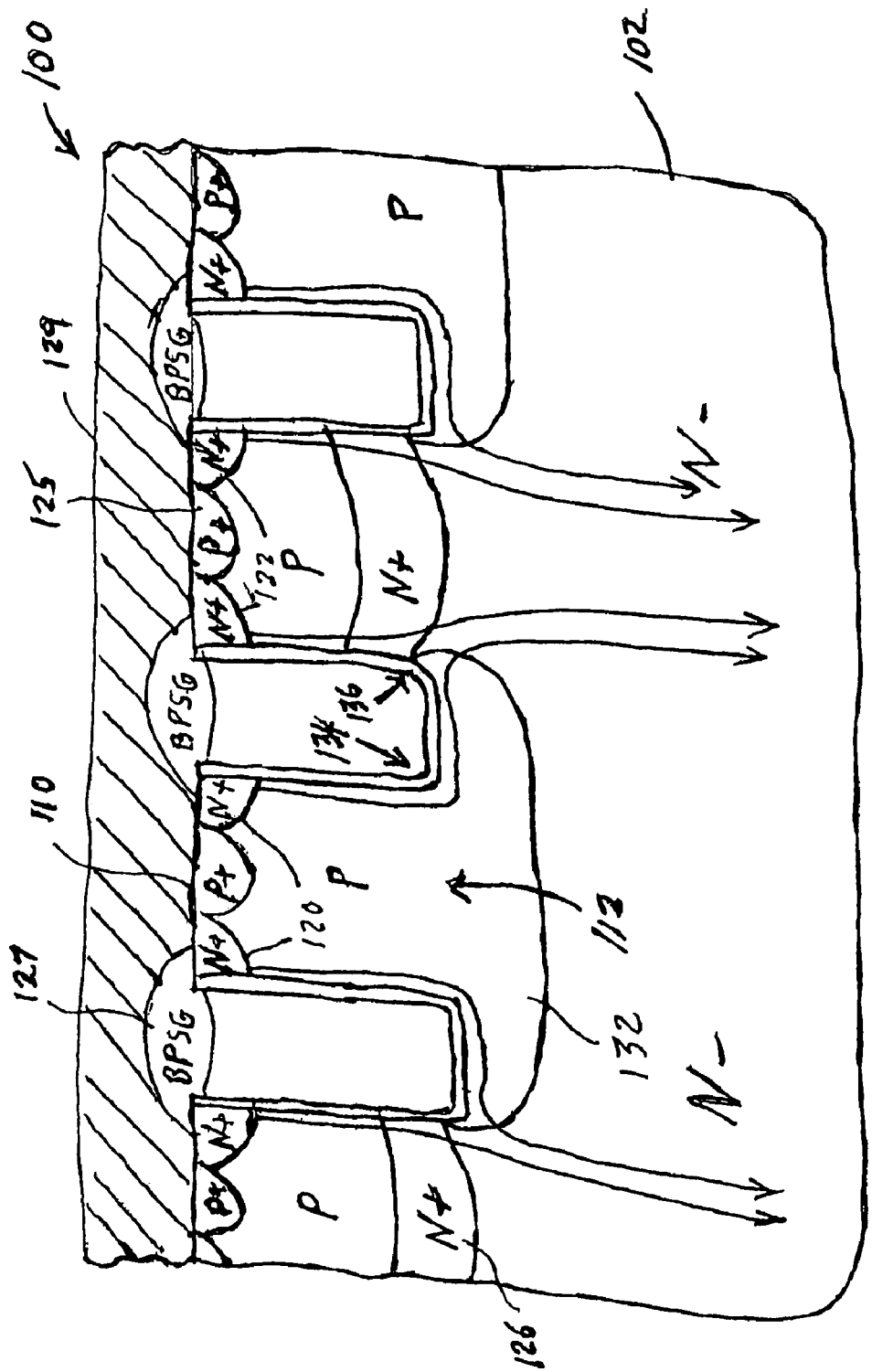
FIG. 3B illustrates the current flows in the MOSFET of FIG. 3A.

When MOSFET 100 is in operation, a current flows in mesa 114 between N+ source regions 122 and N+ drain region 126 through channel regions 128 and 130, depending on the voltage applied to the polysilicon gate electrodes. In mesa 112, a current flows in a path that extends downward from N+ source regions 120, around the bottoms of trenches 104 and 106 to N+ drain regions 126. The current flows in MOSFET 100 are shown in FIG. 3B. Unlike conventional MOSFETs, therefore, the channel length associated with the trench is different in adjacent mesas, one channel length being shorter than the other. This type of structure is not affected easily by the pinching action of the P-body regions at the trench bottoms, because variations in the trench depth do not pinch the channel current, due to the presence of the N+ drain regions on the sides of the trenches.

Figure 1:
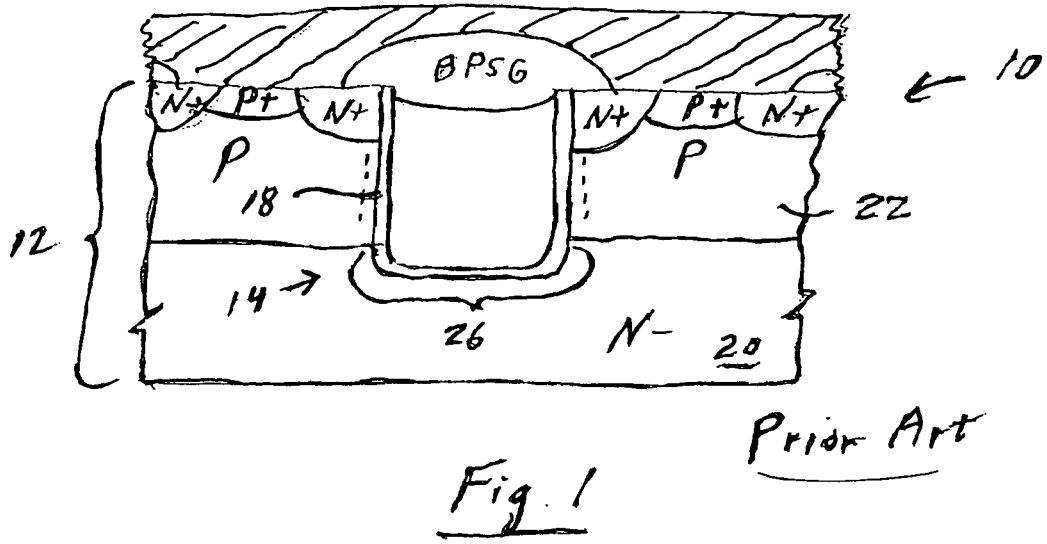
FIG. 1 shows a cross-sectional view of a prior art trench MOSFET.
Figure 2:
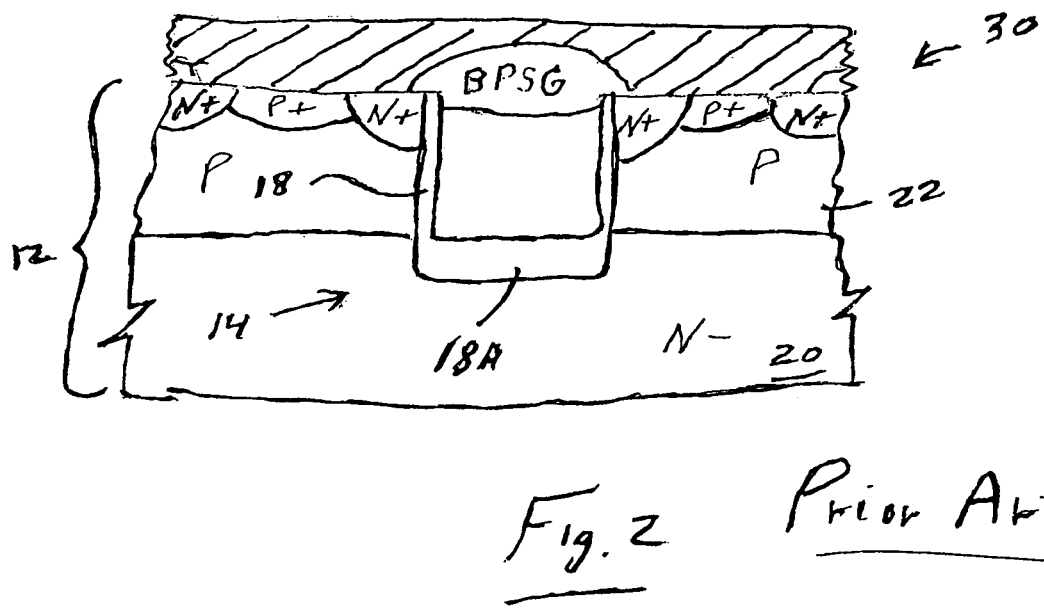
FIG. 2 shows a cross-sectional view of a prior art trench MOSFET having a thickened gate oxide layer at the bottom of the trenches.

Insofar as trenches 106 and 108 are concerned, the drain-gate capacitance of MOSFET 100 arises entirely from the area where N+ drain region 126 abuts trenches 106 and 108. As will be evident, this is a much smaller area than the area designated 26 in FIG. 1, for example, and hence the drain-gate capacitance of MOSFET 100 is much less than that of MOSFET 10 show in FIG. 1. In particular, in this embodiment the drain does not adjoin the bottoms or lower corners of trenches 104, 106 and 108, thereby reducing very significantly the total gate-drain capacitance of the device. Moreover, the drain-gate capacitance is independent of the dimensions (width and depth) of trenches 104, 106 and 108.

FIGS. 4A–4H illustrate a process that may be used to fabricate MOSFET 100, although it will be apparent that other processes could also be used.

Figure 4A:
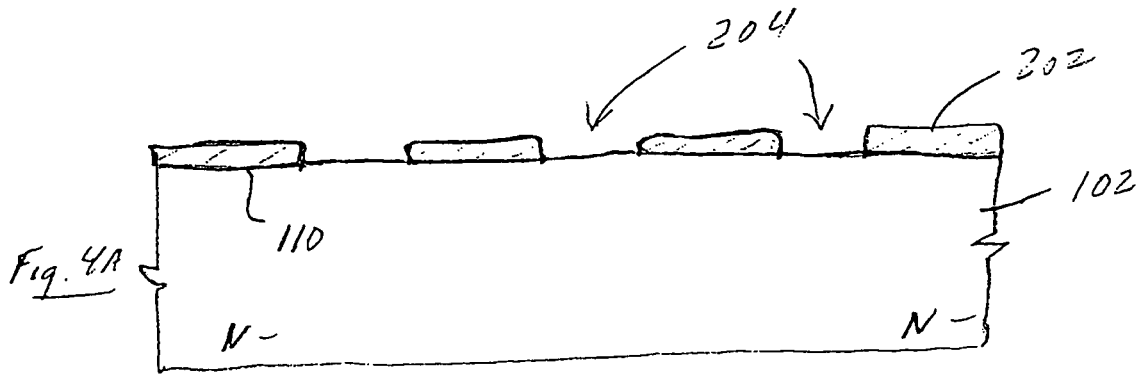

As shown in FIG. 4A, the process begins with semiconductor chip 102, which could be made of silicon, for example. In this embodiment, chip 102 is doped with N-type impurity to a background concentration of $1 \times 10^{16}$ cm$^{-3}$. A photoresist mask 202 is formed on the surface 110 of chip 102 and is patterned using photolithographic techniques to form openings 204 which define the locations of the trenches. The trenches are typically in the form of a lattice extending over surface 110 and could be a series of parallel "strips" or, in a closed cell embodiment, a honeycomb of square, hexagonal or circular cells, for example.

Figure 4B:
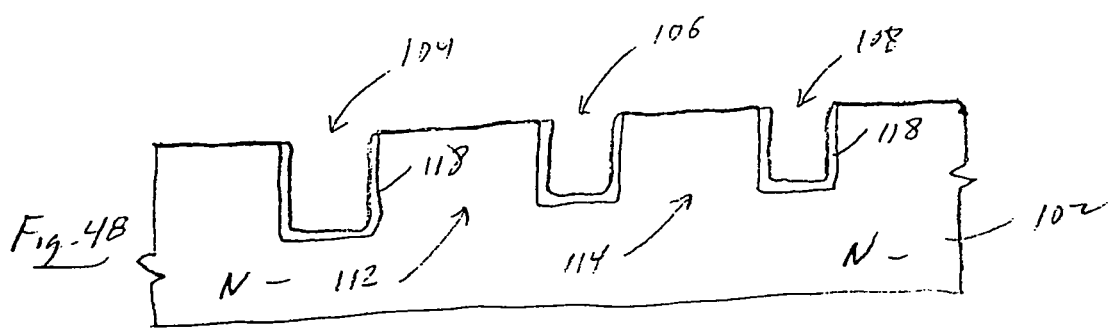

As shown in FIG. 4B, chip 102 is etched through openings 204, using, for example, a reactive ion etch (RIE), to form trenches 104, 106 and 108. At the same time mesas 112 and 114 are formed. A sacrificial oxide layer (not shown) is thermally formed on the walls of the trenches to repair crystal damage caused by the RIE process and is removed. Next, chip 102 is heated to form gate oxide layer 118, which is typically 300 to 500 Å thick.

Figure 4C:
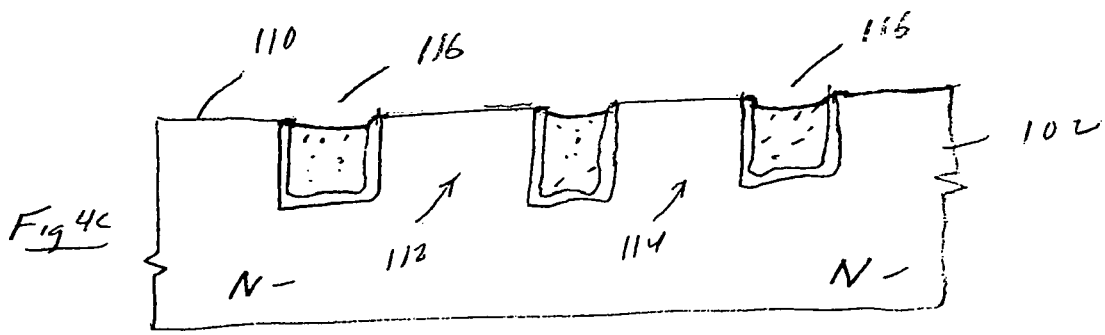

As shown in FIG. 4C, polysilicon 116 is deposited in trenches 104, 106 and 108 and planarized to form a surface generally coplanar with but typically slightly below top surface 110.

Figure 4D:
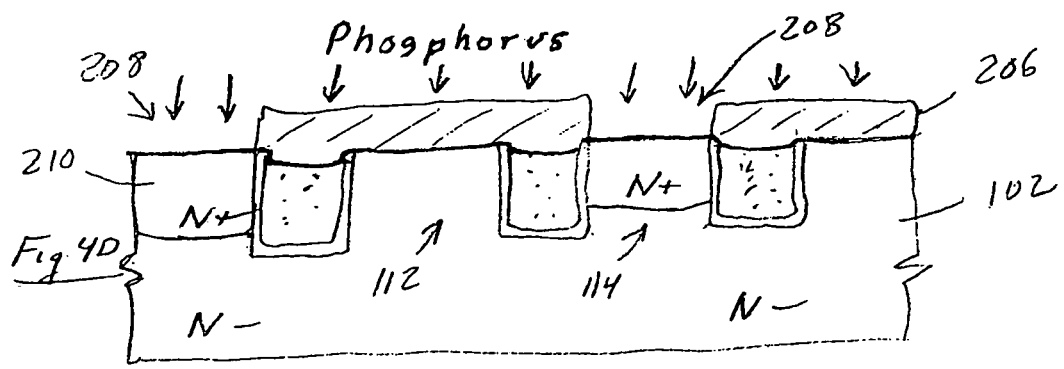

As shown in FIG. 4D, a mask layer 206 is formed on surface 110 and is etched to form openings 208. One of openings 208 is formed over mesa 114. Mask layer 206 can be formed of photoresist and may be applied to chip 102 by a spin-coating process. Mask layer 206 may be 1 µm thick and may be etched using standard photolithographic techniques. An N-type impurity such as phosphorus is implanted through openings 208 at a dose of $1 \times 10^{13}$ cm$^{-2}$ and an energy of 80 keV, for example, to form a diffusion 210 that will later become part of N+ drain region 126.

As shown in FIG. 4E, a P-type impurity such as boron is implanted through openings 208 at a dose of $1 \times 10^{13}$ cm$^{-2}$ and an energy of keV, for example, to form a diffusion 212 that will later become part of P-body region 124. Because of the difference in implant energy, diffusion 212 does not extend as far into chip 102 as diffusion 210. Mask layer 206 is then removed.

As shown in FIG. 4F, a mask layer 214 is formed on surface 110 and is etched to form openings 216. One of openings 216 is formed over mesa 112. Mask layer 214 can be formed of photoresist and may be applied to chip 102 by a spin-coating process. Mask layer 214 may be 1 µm thick and may be etched using standard photolithographic techniques. A P-type impurity such as boron is implanted through openings 216 at a dose of $2 \times 10^{13}$ cm$^{-2}$ and an energy of 280 keV, for example, to form a diffusion 218 that will later become part of P-body region 132. As is apparent from FIG. 4F, diffusion 218 extends throughout most of mesa 112 and forms a junction with the background N-dopant in chip 102 near the base of mesa 112. Mask layer 214 is removed.

As shown in FIG. 4G, chip 102 is annealed at a temperature of 1100° C. for 40 minutes, for example, to drive in N-type diffusion 210 and P-type diffusions 212 and 218. In particular, P-type diffusion 218 is driven downward to the extent that it spreads laterally under trenches 104 and 106 and, in this embodiment, merges with N-type diffusion 210. After the anneal, the diffusions 210, 212 and 218 become N+ drain region 126, P-body region 124 and P-body region 132, respectively.

As shown in FIG. 4H, a mask layer 220 is formed on surface 110 and is etched to form openings 222 over mesas 112 and 114. Mask layer 220 can be formed of photoresist and may be applied to chip 102 by a spin-coating process. Mask layer 220 may be 1 µm thick and may be etched using standard photolithographic techniques. An N-type impurity such as arsenic is implanted through openings 222 at a dose of $8\times10^{15}$ cm$^{-2}$ and an energy of 80 keV, for example, to form N+ source regions 120 and 122. After this, mask layer 220 is removed. The device is masked again and boron is implanted through openings in the mask to form P+ body contact regions 125. BPSG layer 127 is deposited and patterned and metal layer 129 is deposited and patterned to form contacts with N+ source regions 120 and 122 and P-body contact regions 125.

The resulting device is the MOSFET 100 shown in FIG. 3A.

Figure 5:
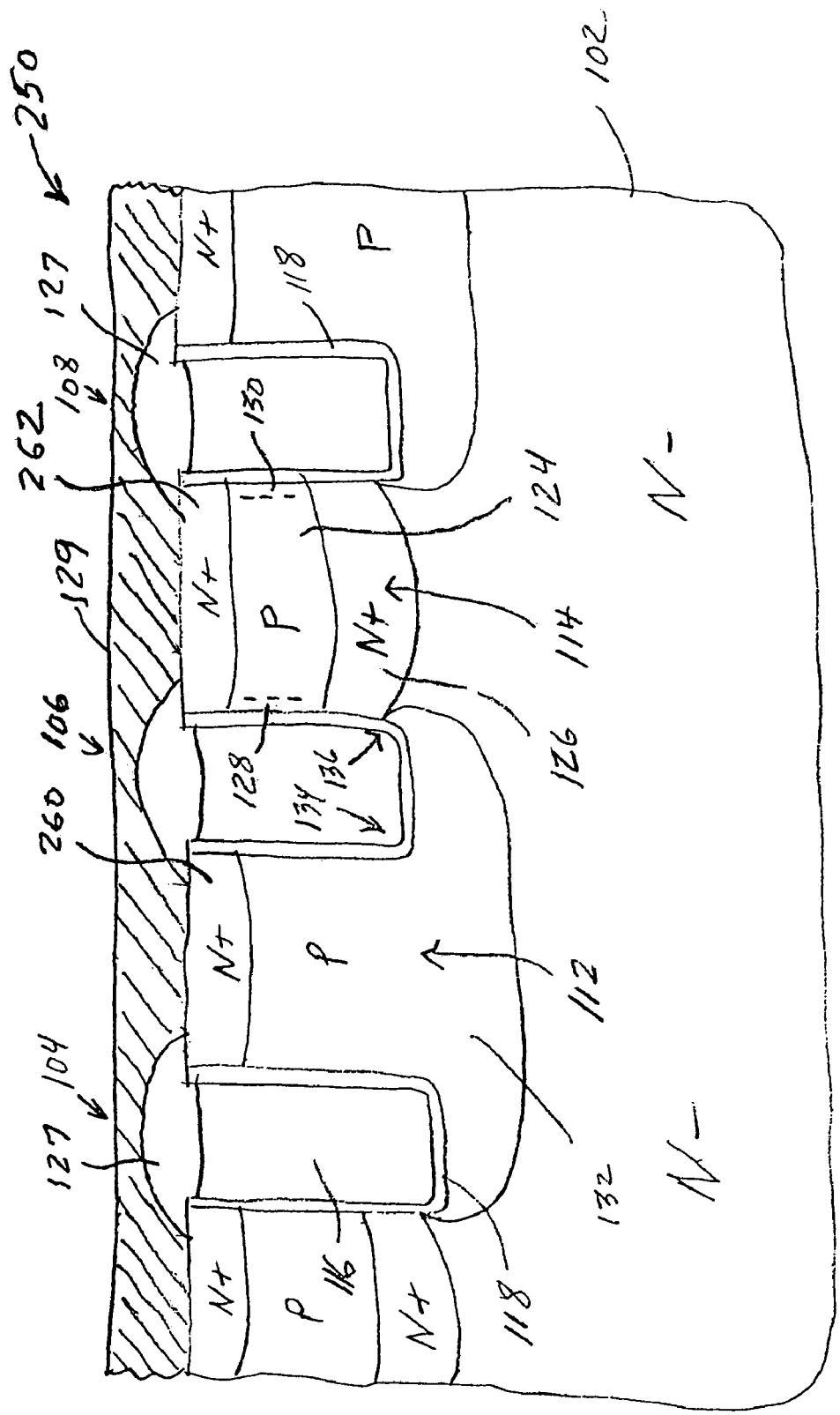
FIG. 5 illustrates a MOSFET in accordance with this invention in which the body region is contacted in the third dimension.

MOSFET 250, shown in FIG. 5, is similar to MOSFET 100, except that N+ source regions 260 and 262 extend all the way across mesas 112 and 114, respectively, and the P-body regions 124 and 132 are contacted in the third dimension, outside of the plane of the drawing, rather than through P+ body contact regions 125 and 131. This embodiment is manufactured in a process similar to that shown in FIGS. 4A–4H, except that in the step shown in FIG. 4H the openings in mask layer 220 extend all the way across mesas 112 and 114 so as to allow the N-type dopant to form N+ source regions 260 and 262. P+ contact regions are formed in the locations where P-body regions are to be contacted by metal layer 129.

Figure 6A:
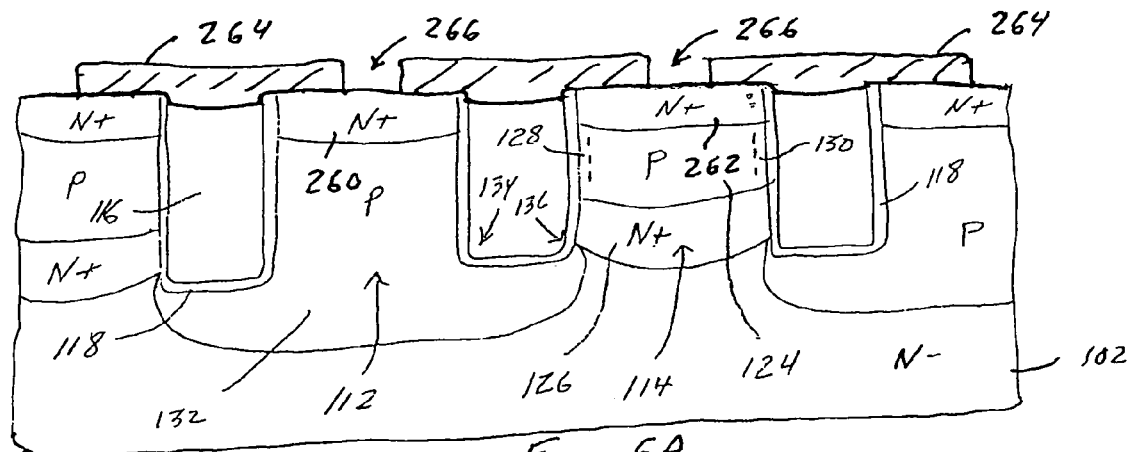
FIGS. 6A–6C illustrate a process for forming a MOSFET with a body contact groove at the top of each mesa.
Figure 6B:
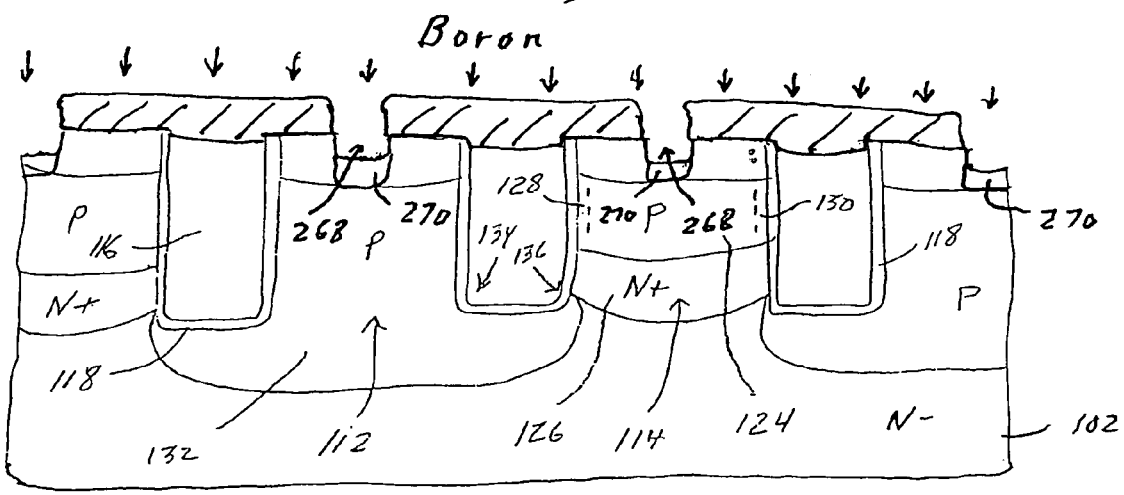
Figure 6C:
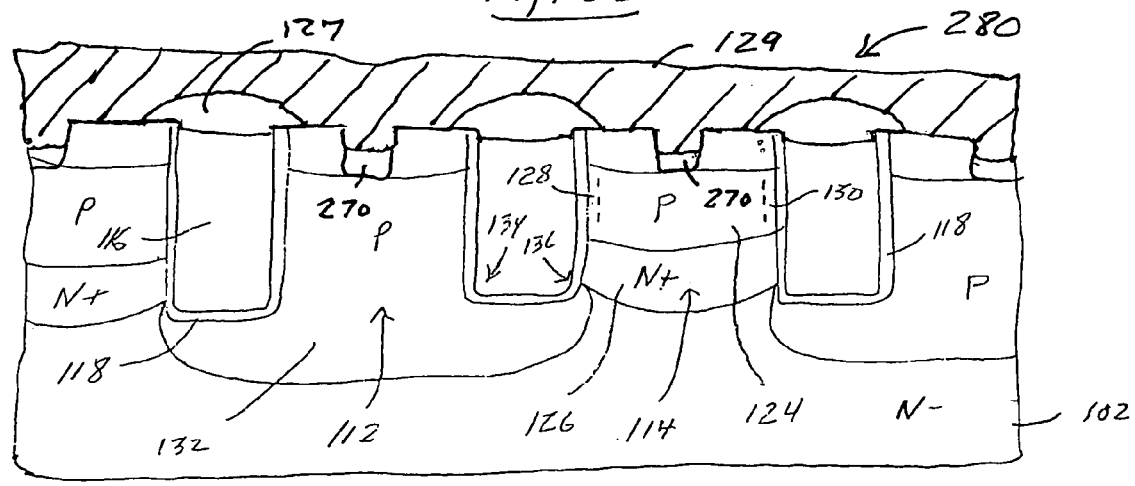

The fabrication of yet another embodiment is shown in FIGS. 6A–6C. Following the implantation of N-type dopant to form N+ regions 260 and 262, as described above, a photoresist mask layer 264 is formed and openings 266 are made in layer 264 by conventional photolithographic techniques. This step of the process is illustrated in FIG. 6A. An RIE process is used to etch grooves 268 in the top surface of chip 102 through openings 266, and boron or another P-type dopant is implanted through openings 264 to form P+ body contact regions 270 adjacent the bottom of grooves 268. This step is illustrated in FIG. 6B. Mask layer 264 is then removed and BPSG layer 127 and metal layer 129 are deposited, as described above. The completed MOSFET 280 is shown in FIG. 6C.

Figure 7A:
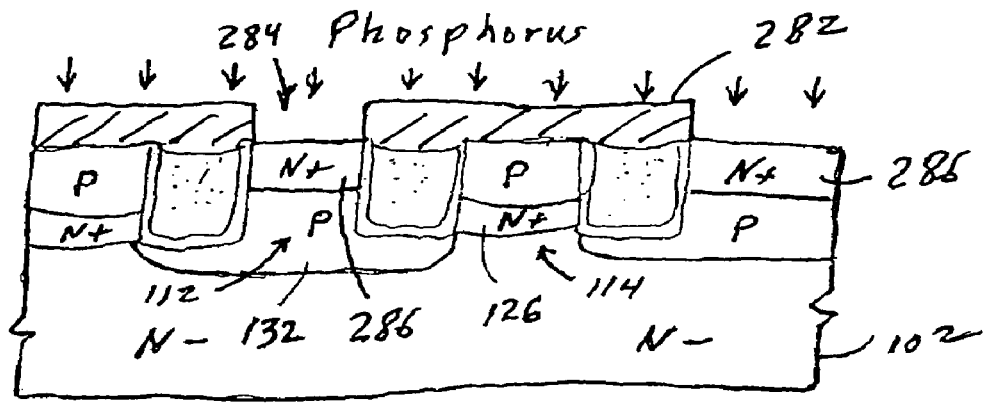
FIGS. 7A–7C illustrate how the length of the channel in each mesa can be varied.
Figure 7B:
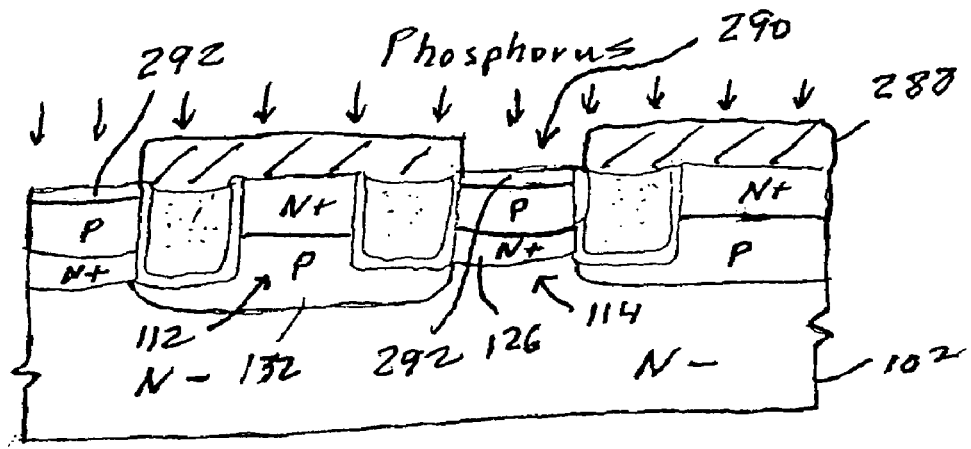
Figure 7C:
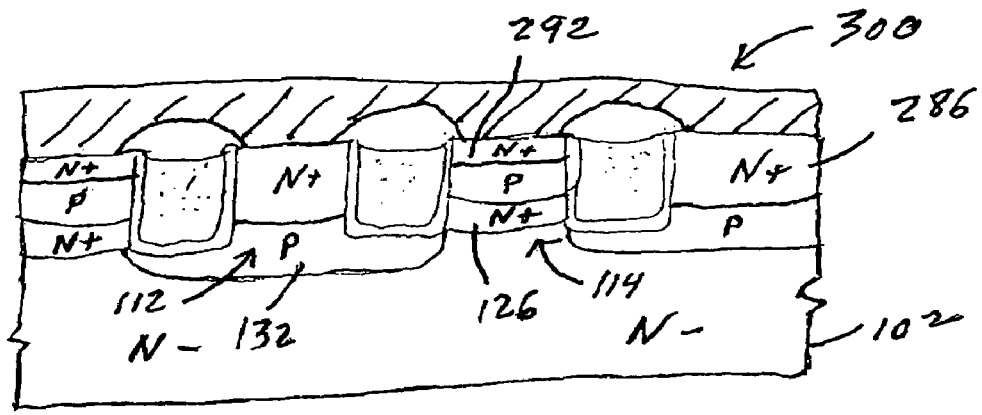

Referring again to MOSFET 250 shown in FIG. 5, the length of the channels in mesas 112 and 114, respectively, can be varied by varying the energy of the N-type dopant that is used to form N+ source regions 260 and 262. For example, FIG. 7A shows chip 102 at the stage shown in FIG. 4G. A photoresist layer 282 is deposited on top surface 110 and patterned using conventional photolithographic techniques to form an opening 284 over mesa 112. Phosphorus is implanted at a dose of $8\times10^{15}$ cm$^{-2}$ and an energy of 120 keV, for example, to form an N+ source region 286 in mesa 112. Mesa 114 is shielded from the phosphorus dopant by photoresist layer 282. The doping concentration and depth of N+ source region 286, and hence the length of the channel in mesa 112, can be varied by adjusting the dose and energy of the phosphorus implant. Photoresist layer 282 is then removed and a new photoresist layer 288 is deposited and patterned to form an opening 290 over mesa 114, as shown in FIG. 7B. Phosphorus is implanted through opening at a dose of $4\times10^{15}$ cm$^{-2}$ and an energy of 80 keV, for example, to form an N+ source region 292 in mesa 114. Because the energy of this implant is less than the energy of the phosphorus implant into mesa 112, N+ source region 292 is shallower than N+ source region 286. Next, the structure is annealed for 40 minutes at a temperature of 1100° C., for example, to activate and drive in the phosphorus dopant. BPSG layer 127 and metal layer 129 are deposited and patterned as described above, yielding MOSFET 300 shown in FIG. 7C. Thus, by varying the dose and energy of the dopant used to form the source regions in adjacent mesas, the channel in each mesa can be set to a desired length that is independent of the length of the channel in the adjacent mesa.

It will be understood that the length of the channels can be adjusted in a similar manner in embodiments such as the one shown in FIG. 3A where the P-body is contacted in each mesa in the plane of the drawing.

While specific embodiments of this invention have been described above, it will be apparent to those of skill in the art that numerous other embodiments may be constructed in accordance with the broad principles of this invention.

I claim:

1. A trench MOSFET comprising:
   a semiconductor chip doped with impurity of a first conductivity type, the chip having first, second and third trenches formed at a surface of the chip, the first and second trenches defining a first mesa, the second and third trenches defining a second mesa;
   a first source region of the first conductivity type in the first mesa, the first source region being adjacent the surface of the chip;
   a second body region of a second conductivity type opposite to the first conductivity type in the first mesa, the second body region forming a first junction with the first source region, the second body region extending below the first and second trenches such that the second body region is adjacent the bottoms of the first and second trenches;
   a third source region of the first conductivity type in the second mesa, the third source region being adjacent the surface of the chip;
   a fourth body region of the second conductivity type in the second mesa, the fourth body region forming a second junction with the third source region, the fourth body region comprising a first channel region adjacent a wall of the second trench; and
   a fifth drain region of the first conductivity type in the second mesa, the fifth drain region forming a third junction with the fourth body region.

2. The trench MOSFET of claim 1 wherein the fourth body region comprises a second channel region adjacent a wall of the third trench.

3. The trench MOSFET of claim 1 wherein the second trench has a first lower corner at a base of the first mesa and a second lower corner adjacent a base of the second mesa, the first body region wrapping around the first and second lower corners.

4. The trench MOSFET of claim 3 wherein the first trench has a third lower corner and a fourth lower corner, the first body region wrapping around the third and fourth lower corners.

5. The trench MOSFET of claim 1 wherein the fifth drain region is doped with impurity of the first conductivity type, a doping concentration of the fifth drain region being greater that a background doping concentration of the chip.

6. The trench MOSFET of claim 1 comprising grooves at the top of the first and second mesas, respectively, and sixth body contact regions doped with impurity of the second conductivity type adjacent bottoms of the grooves.

7. The trench MOSFET of claim 1 wherein the first source region extends downward from a surface of the chip a first distance and wherein the second source region extends downward from said surface of the chip a second distance, said first distance being greater than said second distance.

\* \* \* \* \*